(12) United States Patent
Piirainen

(10) Patent No.: US 6,643,675 B2
(45) Date of Patent: Nov. 4, 2003

(54) FILTERING METHOD AND FILTER

(75) Inventor: Olli Piirainen, Oulu (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/187,443

(22) Filed: Jul. 2, 2002

(65) Prior Publication Data

US 2003/0069911 A1 Apr. 10, 2003

Related U.S. Application Data

(63) Continuation of application No. PCT/FI01/00956, filed on Nov. 1, 2001.

(30) Foreign Application Priority Data

Nov. 3, 2000 (FI) ................................................ 20002423

(51) Int. Cl.[7] ............................................... G06F 17/17
(52) U.S. Cl. ...................................................... 708/313
(58) Field of Search ........................................... 708/313

(56) References Cited

U.S. PATENT DOCUMENTS

| | | | |
|---|---|---|---|
| 5,717,618 A | * 2/1998 | Menkhoff et al. ........... | 708/313 |
| 5,757,867 A | * 5/1998 | Caulfield et al. ............ | 375/350 |
| 5,835,390 A | 11/1998 | Trager ......................... | 708/313 |
| 5,960,091 A | 9/1999 | White et al. ................. | 381/98 |
| 5,980,097 A | 11/1999 | Dagnachew ............ | 364/724.11 |
| 6,057,793 A | 5/2000 | Gong et al. .................. | 341/143 |
| 6,173,302 B1 | 1/2001 | Piirainen ..................... | 708/313 |
| 6,470,365 B1 | * 10/2002 | Rahman et al. ............. | 708/313 |

FOREIGN PATENT DOCUMENTS

| WO | WO 94/23492 | 10/1994 |
|---|---|---|
| WO | WO 98/25342 | 6/1998 |

OTHER PUBLICATIONS

Hogenauer, "An Economical Class of Digital Filters for Decimation and Interpolation," IEEE Transactions on Acoustis, Speech and Signal Processing, vol. ASSP–29, No. 2, Apr. 1981, pp. 155–162.

* cited by examiner

Primary Examiner—David H. Malzahn
(74) Attorney, Agent, or Firm—Pillsbury Winthrop LLP

(57) ABSTRACT

The invention relates to a filtering method and a filter implementing the filtering method. In the solution, a signal is filtered by at least one real FIR filter having at least one stop frequency pair whose different frequencies are symmetrically on different sides of at least one alias frequency.

24 Claims, 4 Drawing Sheets

FILTERING METHOD AND FILTER

This application is a Continuation of International Application PCT/FI01/00956 filed on Nov. 1, 2001 which designated the US and was published under PCT Article 21(2) in English.

FIELD OF THE INVENTION

The invention relates to a filter for the decimation or interpolation of a digital signal.

BACKGROUND OF THE INVENTION

Digital signal processing comprises several applications in which sampling should be changeable. In decimation, the sampling period is extended, whereby the sampling frequency decreases. This reduces the number of data points processed or stored in the memory per a time unit. In interpolation, the sampling period is shortened and the sampling frequency increases and the number of data points per a time unit increases.

There is a need to change sampling for instance in a radio system receiver in which an analogue-to-digital conversion is made to a pass band signal using a high sampling frequency. After the A/D conversion, the frequency of the pass band signal is decreased to a base band, but the sampling frequency still remains high. Sampling can be reduced by using a decimation filter, which also improves the signal-to-noise ratio.

An example of an ordinary decimating or interpolating filter, which changes the sampling of a signal by a high coefficient, is for instance a CIC (Cascaded Integrator-Comb) filter which comprises a set of integrators, a sampler and a set of comb filters after each other in a series. The solution is described in more detail in the publication: E. B. Hogenauer, An Economical Class of Digital Filters for Decimation and Interpolation, which is incorporated herein by reference.

A problem with the decimating and interpolating CIC filter is that the stop band does not efficiently attenuate the interfering signals. Especially if the stop band has interfering signals that are not exactly on the notch frequency of the CIC filter, the interference may damage the operation of the filter.

BRIEF DESCRIPTION OF THE INVENTION

It is thus an object of the invention to provide an improved method and a filter implementing the method so as to efficiently attenuate interference on a wider frequency band. This is achieved by a filtering method in which a signal is processed digitally and sampling is changed by a coefficient M which is a positive integer and which defines alias frequencies on the frequency band of the filtering method. In the method, the signal is further filtered by at least one real Finite Impulse Response (FIR) filter having at least one stop frequency pair whose different frequencies are symmetrically on different sides of at least one alias frequency.

The invention also relates to a filter which is adapted to process a signal digitally and comprises a sampler for changing sampling by coefficient M which is a positive integer and which defines alias frequencies on the frequency band of the filtering method. Further, the filter comprises at least one real FIR filter having at least one complex stop frequency pair whose different frequencies are symmetrically on different sides of at least one alias frequency.

Preferred embodiments of the invention are set forth in the dependent claims.

The invention is based on using two stop frequencies, instead of just one, per each alias frequency, the stop frequencies being generated by a complex conjugate pair in a transfer function.

The solution of the invention provides several advantages. The stop band can be made wider, which enables a more efficient interference elimination and a more reliable filter operation.

BRIEF DESCRIPTION OF THE FIGURES

The invention will now be described in greater detail by means of preferred embodiments and with reference to the attached drawings in which.

DETAILED DESCRIPTION OF THE INVENTION

The described solution is suited for use in changing the sampling of a received signal in a radio system receiver without, however, being limited to it.

Figure 1:
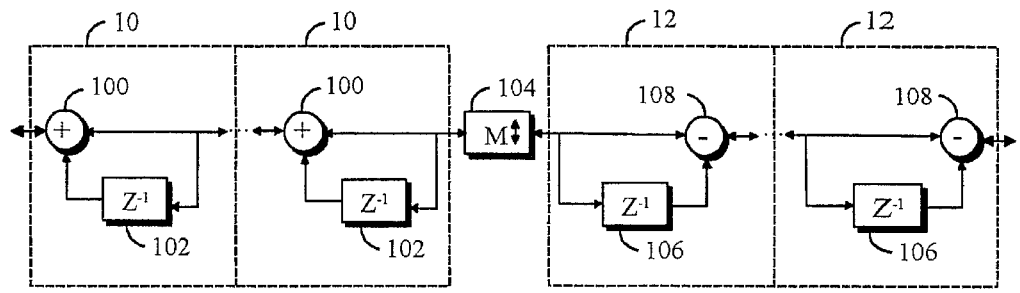
FIG. 1 shows a CIC filter.

Let us first examine a prior-art CIC filter described by way of a block diagram in FIG. 1. The CIC filter comprises N integrators 10 and N comb filters 12, wherein N is a positive integer. Each integrator can be shown by means of an adder 100 and a delay element 102. Each integrator adds a delayed signal to an incoming signal. The comb filter can also be shown by means of a delay element 106 and an adder 108. Each adder 108 subtracts a delayed signal from an incoming signal. Between the integrator block 10 and the comb filter block 12, there is a sampler 104 which changes the sampling by coefficient M, M being a positive integer. When feeding a signal from left to right, the CIC filter of FIG. 1 serves as a decimator. When feeding a signal from right to left, the CIC filter of FIG. 1 serves as an interpolator. When decimating, the CIC filter reduces the sampling frequency by coefficient M and when interpolating, it increases the sampling frequency by coefficient M. The transfer function $H(z)$ of a decimating or interpolating filter is in its z transformation form as follows:

$$H(z)=[(1-z^{-M})/(1-z^{-1})]^N, \qquad (1)$$

wherein z is a frequency variable of z space, $z^{-1}$ represents a unit delay, M is a decimation coefficient, N is the number of order (number of integrators and comb-filtering stages). The zero points of the transfer function of the integrator 10 are the poles of the transfer function of the filter. Thus, z=1 is an N-fold pole. The zero points of the transfer functions of the comb filters are zeros of the filter. This way, the zero point is $z={}^M\sqrt{1}$. For instance, when the sampling change is M=4, the zero points are $z_{1,2,3,4}=\pm 1, \pm j$. The zero points of the filter are also N-fold.

Figure 2A:
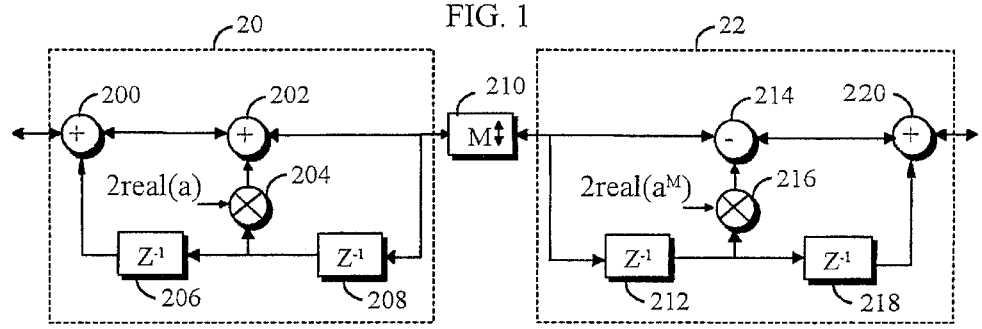
FIG. 2A shows a filter which comprises a second-order Infinite Impulse Response (IIR) filter, a sampler and a second-order FIR filter.

Let us now examine a filter according to the solution described in FIG. 2A, which filter is suited for both interpolation and decimation. The samples propagate in the filter controlled by a clock and addition, subtraction and multiplication are usually done during one clock cycle. The sampler 210 is as the sampler 104 in FIG. 1. In this solution, however, the integrating block 10 of the CIC filter is replaced by a second-order IIR filter 20 which comprises adders 200 and 202, a multiplier 204, and delay elements 206 and 208. The filter can have one or more blocks 20. In the adder 200, a signal delayed in the delay elements 206 and 208 is subtracted from the incoming signal. To the thus obtained difference signal, a signal delayed in the delay element 208 is added, the delayed signal having been multiplied in the multiplier 204 by coefficient 2·real(a), wherein a is a complex parameter of the filter. During decimation, this sum signal propagates towards the sampler 210. During interpolation, the signal arriving at block 20 comes from the sampler 210. The transfer function of block 20 is $$D(z)=(1-az^{-1})\cdot(1-a^*z^{-1})=1-2\cdot\text{real}(a)z^{-1}+z^{-2} \quad (2)$$

The filter is real, because coefficients (1, 2·real(a) and 1) of the polynome are real. Correspondingly, the comb block 12 of the CIC filter is replaced by a second-order FIR filter which comprises delay elements 212 and 218, adders 214 and 220, and a multiplier 216. The filter has as many blocks 22 as blocks 20. In the adder 214, a signal delayed in the delay element 212 is subtracted from the incoming signal, the delayed signal having been multiplied in the multiplier 216 by coefficient 2·real($a^M$), wherein a is a complex parameter of the filter. In the adder 220, a signal delayed in the delay elements 212 and 218 is added to the difference signal. During decimation, this signal is the outgoing signal. During interpolation, the signal arriving at block 22 is fed into the adder 220. The transfer function of block 22 is $$L(z)=(1-(az^{-1})^M)\cdot(1-(a^*z^{-1})^M)=1-2\cdot\text{real}(a^M)z^{-M}+z^{-2M} \quad (3)$$

This filter, too, is real, because the coefficients of the polynome are real. In formulas (2) and (3), a is a complex parameter which can be presented as $a=\alpha+j\beta$, wherein j is an imaginary unit, $a^*$ is the complex conjugate $a^*=\alpha-j\beta$ of parameter a, and the absolute value of parameter a and $a^*$ is 1, i.e. $|a|=|a^*|=\sqrt{\alpha^2+\beta^2}=1$. Parameter a does not, however, obtain the value a=1. Coefficient real(a) preferably obtains the value $$\text{real}(a) = 1 - \frac{1}{2^T},$$

wherein T is a positive integer. In such a case, a is $a=\text{real}(a)+j\sqrt{1-[\text{real}(a)]^2}$. To simplify the multiplication, one should try to have as few ones as possible in the binary format of parameter a.

In a decimating filter, the multiplier 216 can be implemented as a serial multiplier instead of an ordinary multiplier, because the product need not be formed at every clock cycle, but the multiplier 216 has M clock cycles time to form the multiplication product before the next sampling.

Figure 2B:
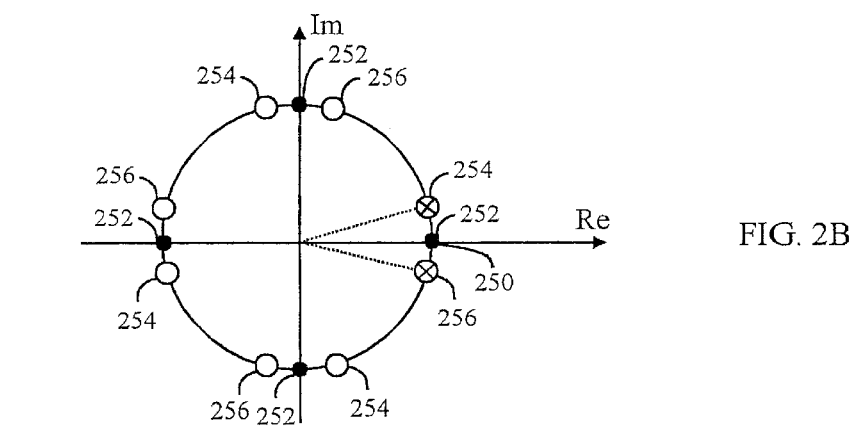
FIG. 2B shows a zero-pole map.

Let us now examine the effect of parameter a on the zero-pole map of the complex frequency space by means of FIG. 2B. The vertical axis Im is imaginary and the horizontal axis Re is real. The frequency band used in filtering, i.e. the operating band of the filter, corresponds to a full circle. Let us assume, for instance, that sampling is changed by coefficient M=4. This produces four alias frequencies 252 and the entire circle is divided into four sections. During decimation, all alias frequencies 252 fold on top of each other on the lowest operating frequency 250 of the [alias] filter on the positive real axis in the same manner as all circle quarters fold on the first quarter. The lowest operating frequency 250 of the filter is a DC component, for instance, i.e. the frequency 250 is 0 Hz. The alias frequency 252 having the highest frequency is depicted at the same point as the lowest frequency 250 of the filter. During decimation, the alias frequency 252 $f_{alias}$ is $f_{alias}=k\cdot(f_{sample}/M)$, wherein k is $k=[1, \ldots, M]$. During interpolation, the corresponding alias frequency 252 on the positive real axis multiplies into three other alias frequencies 252. Similarly, the first quarter multiplies into three other quarters. During interpolation, the alias frequency is thus $f_{alias}=(M-i)\cdot f_{sample}$, wherein i is $i=[0, \ldots, M-1]$. In the presented solution, parameter a is used to affect the filtering in such a manner that corresponding to the alias frequencies 252, there are two complex frequencies 254 and 256 derived from parameter a that are located symmetrically on different sides of the alias frequencies 252 and that are stop frequencies of filtering. The complex frequencies 254 and 256 are also in the same way on different sides of the lowest frequency 250 of the filter. Filtering amplification on these two stop frequencies is substantially zero, i.e. the transfer function obtains the value zero. Mathematically, this is:

$$H(z) = \frac{L(z)}{D(z)} = 0 \Rightarrow L(z) = \left(1-(az^{-1})^M\right)\cdot\left(1-(a^*z^{-1})^M\right) = 0.$$

The result is two times M zero points. For instance, if the sampling change coefficient M is M=4, the zero points are $z_1=a$, $z_2=a^*$, $z_3=\exp(j\pi/4)\cdot a$, $z_4=\exp(j\pi/4)\cdot a^*$, $z_5=\exp(j\pi/2)\cdot a$, $z_6=\exp(j\pi/2)\cdot a^*$, $z_7=\exp(j3\pi/4)\cdot a$ and $z_8=\exp(j3\pi/4)\cdot a^*$, which are points 254 and 256 in FIG. 2B.

The poles of the transfer function of filtering are at the zero points of the denominator, i.e. $D(z)=(1-az^{-1})\cdot(1-a^*z^{-1})=1-2\cdot\text{real}(a)z^{-1}+z^{-2}=0$. The result is pole frequencies z=a and z=a* corresponding to the zero points, both being simple zero points on both sides of the lowest operating frequency 250 of the filter.

Thus in the presented solution, there is a complex conjugate pair a and a* for each alias frequency $f_{alias}$ in such a manner that the average value of the complex conjugate pair corresponds to the alias frequency $f_{alias}$ in the z frequency space. The complex conjugate pair a and a* thus unambiguously defines the pole and stop frequencies of the filter.

Figure 2C:
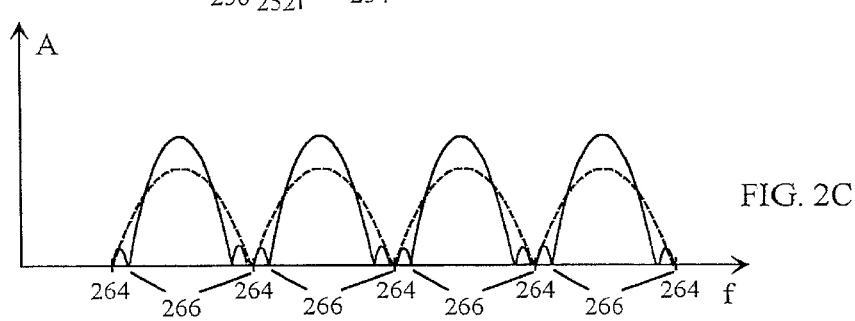
FIG. 2C shows the amplification of the disclosed filter and the CIC filter as a function of the frequency.

FIG. 2C shows a descriptor 260 of the transfer function of a conventional CIC filter and a descriptor 262 of the transfer function of a filter according to the presented solution. The vertical axis shows filter amplification A on a freely selected scale and the horizontal axis shows frequency f. The CIC filter has only one stop frequency for each alias frequency. In the presented solution, the use of at least one complex conjugate pair (FIG. 2C shows the impact of only one complex conjugate pair) produces at least two real stop frequencies 266 (FIG. 2C has only two stop frequencies) for each alias frequency 264 and the widening of the stop band, which improves the interference immunity of the filter, because even though the interference is not exactly on the alias frequency 264, it still attenuates strongly as long as it is between two stop frequencies (a small deviation outside the stop frequency range is also possible). For instance GSM (Global System for Mobile Communication) and WCDMA (Wide-band Code Division Multiple Access) radio systems require a high attenuation of the interference power on a stop band, and high attenuation is possible with the presented solution. Because two complex conjugate pairs widen the stop band, spurious frequencies can be easily attenuated to the extent required by a wide band.

Figure 2D:
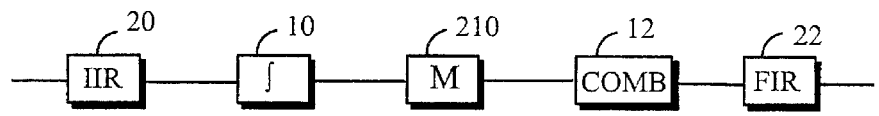
FIG. 2D shows a filter which comprises a CIC filter and a second-order IIR filter and FIR filter on different sides of the CIC filter.
Figure 2E:
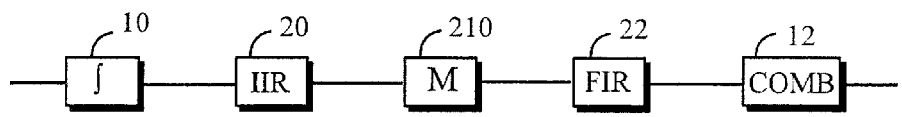
FIG. 2E shows a filter which comprises an integrator, a second-order IIR filter, a sampler, a second-order FIR filter and a comb filter.

FIGS. 2D and 2E show solutions in which the presented solution is combined with a CIC filter known per se. The solution of FIG. 2D comprises at least one second-order IIR filter 20, at least one block 10, a sampler 210, at least one block 12 and at least one second-order FIR filter 22. The solution in FIG. 2E comprises at least one block 10, at least one second-order IIR filter 20, a sampler 210, at least one second-order FIR filter 22 and at least one block 12. The blocks can also be arranged as follows: 10, 20, 210,12 and 22. The mutual order of blocks 10 and 20 bears no significance to the solution, and neither does the mutual order of blocks 12 and 22.

In FIGS. 2D and 2E, there are as many blocks 12 as blocks 10. Similarly, there are as many blocks 20 as blocks 22. Further, blocks 10 and 12 are the same as blocks 10 and 12 of FIG. 1. Correspondingly, blocks 20, 22 and 210 are the same as blocks 20, 22 and 210 of FIG. 2A.

The transfer function of the filter according to FIGS. 2D and 2E is generally:

$$H(z) = R(z)\frac{L_1(z)\ldots L_p(z)}{D_1(z)\ldots D_p(z)} \text{ or } H(z) = \frac{L_1(z)\ldots L_p(z)}{D_1(z)\ldots D_p(z)}R(z) \quad (4)$$

wherein the number p of terms is a positive integer and the term R(z) refers to the filter transfer function known per se. The transfer function R(z) can for instance be the transfer function of the CIC filter. Each term $D_i(z)$ refers to a second-order IIR filter (such as block 20) and each term $L_i(z)$ refers to a second-order FIR filter (such as block 22). In each block $D_i(z)$ and $L_i(z)$, the parameter of the filter is $a_i$ which determines each zero and pole of the transfer function. Parameter $a_i$ of each block i differs from parameters $a_j$ of the other blocks, wherein j≠i. In addition, none of parameters a is one, i.e. $a_1 \ldots a_p \neq 1$, and the absolute value of all parameters a is one, i.e. $|a_1|= \ldots =|a_p|=1$. The number p of blocks $D_1(z) \ldots D_p(z)$ and $L_1(z) \ldots L_p(z)$ is at least one.

The filter transfer function which is $$H(z) = \frac{L_1(z)\ldots L_p(z)}{D_1(z)\ldots D_p(z)}$$

can be presented as H(z)=G(z). Similarly, the filter transfer function which is $$H(z) = R(z)\frac{L_1(z)\ldots L_p(z)}{D_1(z)\ldots D_p(z)} \text{ or } H(z) = \frac{L_1(z)\ldots L_p(z)}{D_1(z)\ldots D_p(z)}R(z),$$

wherein R(z) is the transfer function of a known filtering method, can be presented as H(z)=R(z)G(z) or H(z)=G(z)R(z). The transfer function R(z) can be CIC filtering or any other desired filtering. In both above cases, G(z) can be presented in a power series form G(z)=c(0)+ . . . +c(p)$z^{-2pM}$. The serial-form term G(z) can be implemented as a FIR filter, because coefficients c(i), wherein i=[1, . . . p], always unambiguously depend on parameter a and the complex conjugate a* of parameter a. For instance, coefficient c(0) is c(0)=1 and coefficient c(p) is c(p)=$(a_1 a^*_1)^M \cdot \ldots \cdot (a_p a^*_p)^M$. Especially if the transfer function $$H(z) = \frac{L_1(z)\ldots L_p(z)}{D_1(z)\ldots D_p(z)}$$

can be presented as $$H(z) = G(z) = \frac{L(z)^p}{D(z)^p},$$

wherein parameter a of all blocks L(z) and D(z) is the same, G(z) can be presented as G(z)=1+ . . . +(aa*)$^{pM} z^{-2pM}$. By implementing the power series-form term G(z) as a FIR filter, the stability of the filter improves. In addition, to simplify the multiplication, one should try to have as few ones as possible in the binary format of coefficients c(0) to c(p). Coefficients c(0) to c(p) of the term G(z) can be non-integers. In the presented solution, a non-integer coefficient c(i) can be rounded to an integer. This simplifies the structure.

At least one zero pair in the term G(z) can also be left out, in which case the corresponding multiplication is not done or the multiplier implemented. This means that one of the transfer function parts $L_i(z)$ of the second-order FIR filter is not implemented. Then at least one term L(z) of the second-order FIR filtering that is a pair of a term D(z) of the second-order IIR filtering is left out, and the term G(z) is $$G(z) = \frac{L_1(z)\ldots L_v(z)}{D_1(z)\ldots D_p(z)},$$

wherein v is a positive integer with v<p. This can be done especially when the filter transfer function is H(z)=R(z)G(z), wherein R(z) alone already band-stop filters efficiently. This, too, simplifies the structure, because the number of FIR filter coefficients becomes smaller. After the term $L_i(z)$ is removed, the weighting coefficients of the taps of the term G(z), i.e. the values of parameters a and a*, can be altered in comparison with the original values to improve filtering.

When implementing a decimator as presented herein, it is possible, instead of each FIR block 22 shown in FIG. 2A, to use FIR filters whose input signal is the input signal of the delay elements, and to reset the delay elements to zero at the sampling time of the sampler. Let us first examine the theoretical basis of this solution. The output signal Y(z) of the z variable of the filter in the frequency space is a product of the impulse response H(z) and the input signal X(z) of the filter: Y(z)=H(z)X(z). Adding to and subtracting from the input signal one or more desired signals A(z) does not change the output signal Y(z). This means that $$Y(z) = H(z)\left[X(z) + \sum_{i=0}^{W} A_i(z) - \sum_{i=0}^{W} A_i(z)\right]$$

$$= H(z)\left[X(z) + \sum_{i=0}^{W} A_i(z)\right] - H(z)\sum_{i=0}^{W} A_i(z),$$

wherein W refers to the number of signals A(z) to be added. The added signal A(z) is preferably a reset signal of the delay elements 212 and 218 that empties the content of the delay elements. This is shown in the term $$H(z)\left[X(z) + \sum_{i=0}^{W} A_i(z)\right].$$

When the delay elements are reset to zero after each sampling, overload situations due to a possible DC offset are avoided and a more reliable operation achieved in all conditions. The impact of one or more reset signals A(z) is noted by the term $$H(z)\sum_{i=0}^{W} A_i(z)$$

when forming the output signal Y(z). The term $$H(z)\sum_{i=0}^{W} A_i(z)$$

can be implemented by a FIR filter.

A problem with a second-order IIR filter may be that the data fed into it does not have zero as a long-term expected value, i.e. the data may include DC offset. Already a small DC offset in the data causes an overload in the second-order IIR filters and malfunction in the decimating filter. To avoid DC offset, it is possible to use twos complement arithmetics or the like in which positive and negative numbers are obtained from each other by a simple change of bit. Increasing the word length of the decimating filter can often also reduce the problem. The problem can, however, be eliminated by resetting the delay elements to zero at every sampling, in which case DC offset does not cause an overload. In addition, having the poles of the filter on a unit circle increases the instability of the filter, but resetting the delay elements as described improves stability.

Figure 3:
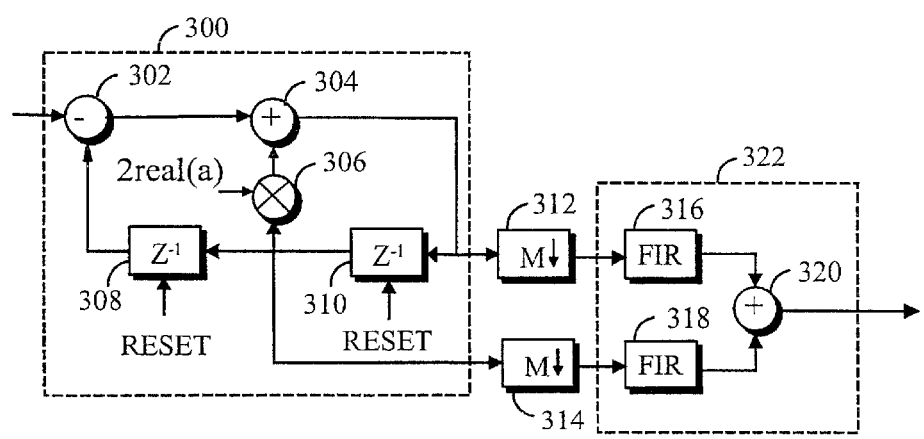
FIG. 3 shows a second-order decimator whose delay elements are reset regularly.

FIG. 3 shows as a block diagram the implementation of a second-order decimator in which the delay elements are reset to zero at the sampling time of the sampler. The solution comprises a second-order IIR filter 300 corresponding to block 20 of FIG. 2A. Block 300 comprises adders 302 and 304, a multiplier 306 and delay elements 308 and 310. In addition, instead of block 22 of FIG. 2A, the solution comprises FIR filters 316 and 318 and an adder 320 in block 322. The solution also comprises samplers 312 and 314 that decimate by coefficient M. When the samplers 312 and 314 sample signals to be fed into the delay elements 308 and 310, the content of the delay element 308 is at the same time reset to zero by a signal $A_1(z)$ and the content of the delay element 310 is reset to zero by a signal $A_2(z)$. The sample of the samplers 312 and 314 is fed to the FIR filters 316 and 318, the FIR filter 316 having a transfer function $H_{FIR1}(z)$ of $H_{FIR1}(z)=-H(z)\ A_1(z)$ and the FIR filter 318 having a transfer function $H_{FIR2}(z)$ of $H_{FIR2}(z)=-H(z)\ A_2(z)$. The output signals of the FIR filters 316 and 318 are summed in the adder 320, whereby the output signal of the filter is formed.

Figure 4A:
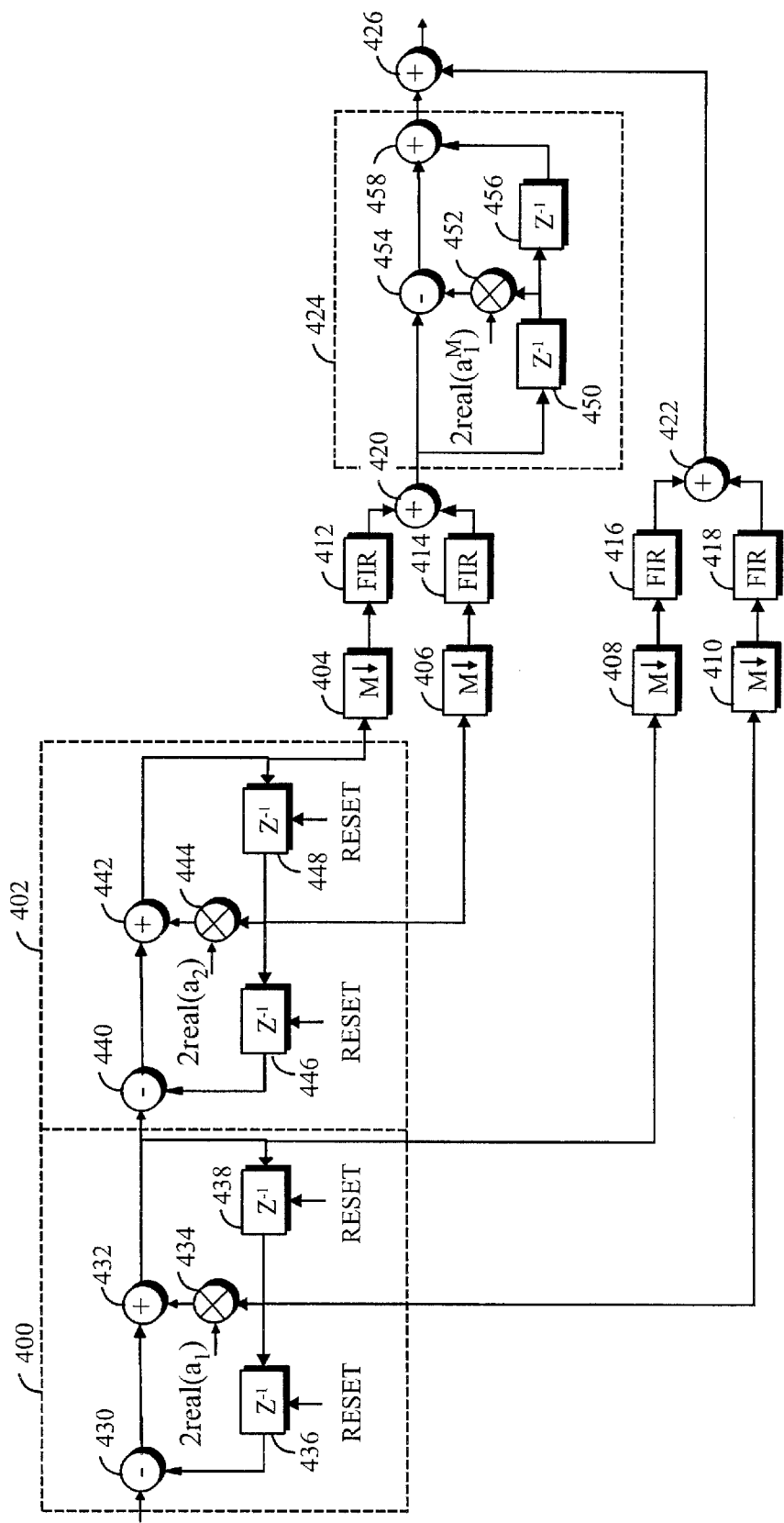
FIG. 4A shows a fourth order decimator whose delay elements are reset regularly.

FIG. 4A shows a block diagram of a fourth-order decimator, the principle of which can also easily be used for higher-order decimators. The decimator comprises two second-order IIR filters 400, 402, samplers 404 to 410 that decimate by coefficient M, FIR filters 412 to 418, adders 420 and 422, a second-order FIR filter 424 and an adder 426. The second-order IIR filter 400 comprises adders 430 and 432, a multiplier 434 and delay elements 436 and 438. The second-order IIR filter 402 comprises adders 440 and 442, a multiplier 444 and delay elements 446 and 448. The second-order FIR filter 424 comprises delay elements 450 and 456, adders 454 and 458 and a multiplier 452 whose coefficient $2\text{real}(a_1^M)$ depends on coefficient $2\text{real}(a_1)$ of the IIR filter 400. The operation of the second-order FIR filter 424 can be located in the FIR blocks 412 and 414 and block 424 need not be implemented separately.

Figure 4B:
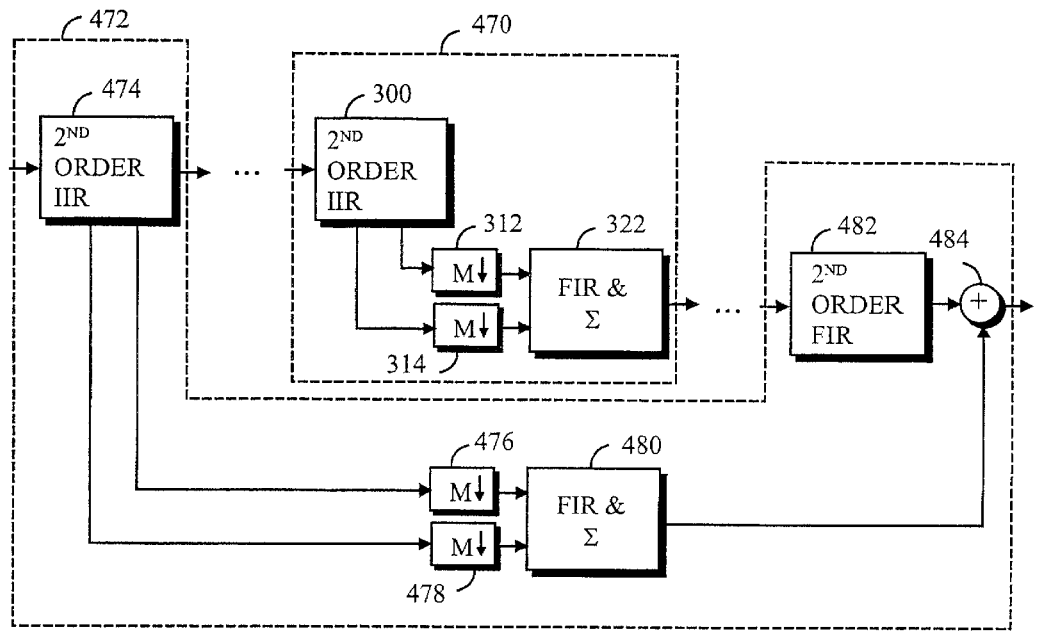
FIG. 4B shows a general block diagram of a decimator whose delay elements are reset regularly.

FIG. 4B shows a general block diagram of a decimator of a higher order than the second order. The decimator comprises a second-order filter 470 which comprises blocks 300, 312, 314 and 322 as in FIG. 3. In addition, the decimator comprises at least one second-order IIR filter 472. For each second-order IIR filter unit 474, the decimator comprises samplers 476 and 478 and a block 480 (block 480 is similar to block 322), one second-order FIR filter 482 and an adder 484 in block 472. The adder 484 sums the signal arriving from the second-order FIR filter 482 with the signal arriving from block 480. In this solution, too, the operation of the second-order FIR filter 482 can be combined with the FIR blocks of the previous order (if the previous order is block 470, the FIR block 482 can be combined with block 322) as shown in the solution of FIG. 4A.

Figure 5:
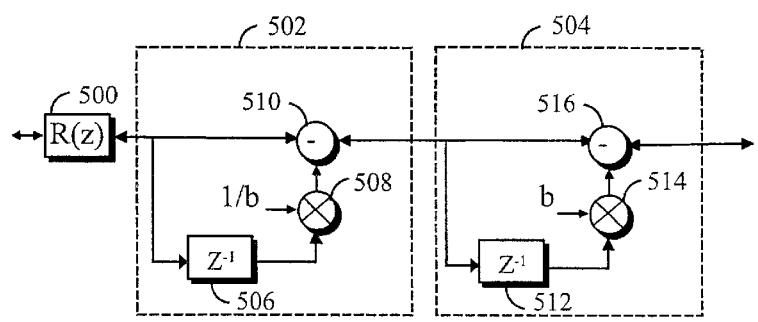
FIG. 5 shows a filter having two comb filters operationally connected to it.

In the presented solution, two extra comb filter blocks can yet be added to the end of the decimator or to the beginning of the interpolator. Such a solution is shown in FIG. 5. The filter comprises a block 500, which is a prior-art CIC filter or a filter block according to FIGS. 2A, 2C, 2D, 3A or 3B, and at least one comb filter pair 502 and 504 whose operation is affected by parameter b. In the comb filter 502, a signal delayed by the delay element 506 is multiplied in the multiplier 508 by coefficient 1/b and the result is subtracted in the adder 510 from a signal received by it. In the second comb filter 504, the signal delayed by the delay element 512 is multiplied in the multiplier 514 by coefficient b and the result is subtracted in the adder 516 from a signal received by it. The following applies to parameter b: b is real, the value of parameter b is positive and unequal to 1. When using the comb blocks 502 and 504 in filtering, the filtering keeps the linear phase properties of the signal and the ripple of the amplification of the pass band decreases.

Let us yet shortly examine the FIR and IIR filters. In time space, the output y(n) of a K-tap FIR filter can be presented as $$y(n) = \sum_{k=0}^{K-1} h(k) \times (n-k), \quad (5)$$

wherein h(k) is a tap coefficient and k is the sample index. Correspondingly, the output of an IIR filter is $$y(n) = \sum_{k=0}^{\infty} h(k) \times (n-k) \quad (6)$$

which shows that a fed impulse affects the output for an indefinite time.

Even though the invention has been explained in the above with reference to examples in accordance with the attached drawings, it is clear that the invention is not restricted to them but can be modified in many ways within the scope of the inventive idea disclosed in the attached claims.

What is claimed is:

1. A filtering method, the method comprising:
   processing a signal digitally including filtering said signal using at least one real infinite impulse response (IIR) filter; then changing a sampling frequency of said signal by a coefficient M which is a positive integer and which defines alias frequencies on the frequency band of a filter; then filtering the signal by at least one real finite impulse response (FIR) filter having at least one stop frequency pair whose frequencies are located symmetrically on different sides of at least one of said alias frequencies.

2. A method as claimed in claim 1, wherein a transfer function of the at least one FIR filter comprises a term L(z) describing a second-order FIR filter that is $L(z)=(1-(az^{-1})^M)\cdot(1-(a^*z^{-1})^M)$, wherein a and a* are complex parameters of the filter having an absolute value of 1 and defining stop frequencies of the FIR filter, and a* is a complex conjugate of parameter a.

3. A method as claimed in claim 2 wherein the real part of parameter a is $$1 - \frac{1}{2^T},$$

and T is a positive integer.

4. A method as claimed in claim 1, further comprising:

filtering said signal using at least two comb filters which form a comb filtering pair and which have a common parameter b affecting the filtering operation;

calculating a transfer function of a first filter of the comb filtering pair to obtain a zero point having value b as the stop frequency; and calculating a transfer function of a second filter of the comb filtering pair to obtain a zero point having value 1/b as the stop frequency, wherein b is real, positive and unequal to 1.

5. A method as claimed in claim 1, wherein said at least one IIR filter has, corresponding to the lowest operating frequency of the filter, at least one complex pole frequency pair whose frequencies are located symmetrically on different sides of the lowest operating frequency of the filter, wherein said at least one IIR filter and said at least one FIR filter have the same filtering parameters a and a* that define the stop and pole frequency pairs of said IIR and FIR filters, and wherein a and a* are complex parameters of the filter having an absolute value of 1, and a* is a complex conjugate of parameter a.

6. A method as claimed in claim 1, further comprising resetting delay elements of said at least one IIR filter to zero when a decimated sample is taken, wherein the sampling frequency of the signal includes sampling by decimating signals delayed in said IIR filter.

7. A method as claimed in claim 1, further comprising calculating a transfer function H(z), the transfer function being determined by a quotient D(z) of at least one second-order IIR filter and at least one second-order FIR filter L(z) which is $$\frac{L_1(z) \ldots L_v(z)}{D_1(z) \ldots D_p(z)},$$

wherein p and v are positive integers.

8. A method as claimed in claim 7, wherein the calculated transfer function includes a pre-defined transfer function R(z) such that the calculated transfer function is determined by $$H(z) = R(z)\frac{L_1(z) \ldots L_v(z)}{D_1(z) \ldots D_p(z)} \text{ or } H(z) = \frac{L_1(z) \ldots L_v(z)}{D_1(z) \ldots D_p(z)}R(z),$$

wherein the second-order FIR filter term $L_i(z)$ is $L_i(z)=(1-(a_iz^{-1})^M)\cdot(1-(a^*_iz^{-1})^M)$ and the second-order IIR filter term $D_i(z)$ is $D_i(z)=(1-a_iz^{-1})\cdot(1-a^*_iz^{-1})$, wherein i is a filtering index, p is a positive integer and $a_i$ is a complex parameter of the filter, the absolute value of which is 1 and which defines the stop and pole frequency, and $a^*_i$ is a complex conjugate of parameter $a_i$.

9. A method as claimed in claim 7, further comprising:

performing IIR filtering using the second-order IIR filtering and performing FIR filtering using the second order FIR filtering, wherein the IIR filtering and the FIR filtering have the same filtering parameters a and a*, and there are as many second-order FIR terms L(z) as second-order IIR terms D(z), in which case v=p applies to the indexes p and v;

performing the second-order FIR filtering in such a manner that the transfer function L(z) of the second-order FIR filtering is $L(z)=(1-(az^{-1})\cdot(1-(a^*z^{-1})$;

performing the second-order IIR filtering in such a manner that the transfer function D(z) of the IIR filtering corresponds to $D(z)=(1-(az^{-1})\cdot(1-(a^*z^{-1})$, wherein a and a* are complex parameters of the filter having an absolute value of 1 and defining stop and pole frequencies, and a* is a complex conjugate of parameter a.

10. A method as claimed in claim 1, further comprising calculating a transfer function of series form $G(z)=c(0)+ \ldots +c(p)z^{-2pM}$ that is provided as a quotient $$G(z) = \frac{L_1(z) \ldots L_v(z)}{D_1(z) \ldots D_p(z)}$$

of products $L_1(z)\cdot \ldots \cdot L_p(z)$ and $D_1(z)\cdot \ldots \cdot D_p(z)$, wherein G(z) is implemented using a FIR filter, and wherein the term $L_i(z)$ of the second-order FIR filtering is $L_i(z)=(1-(a_iz^{-1})^M)\cdot(1-a^*_iz^{-1})^M)$ and the term $D_i(z)$ of the second-order IIR filtering is $D_i(z)=(1-a_iz^{-1})\cdot(1-a^*_iz^{-1})$, wherein i is a filtering index, p is a positive integer and $a_i$ is a complex parameter of the filter, the absolute value of which is 1 and which defines the stop and pole frequency, and a* is a complex conjugate of parameter a.

11. A method as claimed in claim 10, wherein at least one non-integer coefficient is rounded to an integer when one or more coefficients c(0) to c(p) are other than integers.

12. A method as claimed in claim 10, wherein at least one term L(z) of the second-order FIR filter is left out, which is the pair of a second-order IIR filter D(z), whereby the term G(z) is $$G(z) = \frac{L_1(z) \ldots L_v(z)}{D_1(z) \ldots D_p(z)},$$

wherein v<p applies.

13. A filter arranged to process a signal digitally having a sampler for changing a sampling frequency of said signal by a coefficient M which is a positive integer and which defines alias frequencies on a frequency band, the filter comprising:

at least one real FIR filter having at least one complex stop frequency pair whose frequencies are located symmetrically on different sides of at least one alias frequency; and at least one real IIR filter, wherein the sampler is operational between the at least one IIR filter and the at least one FIR filter.

14. A filter as claimed in claim 13, wherein said at least one IIR filter has, corresponding to the lowest operating frequency of the filter, at least one complex pole frequency pair whose frequencies are located symmetrically on different sides of the lowest operating frequency of the filter, and wherein said at least one IIR filter and said at least one FIR filter have the same filtering parameters a and a* that define the stop and pole frequency pairs of said IIR and FIR filters, and a and a* are complex parameters of the filter having an absolute value of 1, and a* is a complex conjugate of parameter a.

15. A filter as claimed in claim 13, further comprising a portion configured to calculate a transfer function H(z) of the filter, the transfer function being determined by a quotient of at least one second-order IIR filter D(z) and at least one second-order FIR filter L(z) which is $$\frac{L_1(z) \dots L_v(z)}{D_1(z) \dots D_p(z)},$$

wherein p and v are positive integers.

16. A filter as claimed in claim 15, wherein the second-order IIR filter and the second-order FIR filter have the same filtering parameters $a_i$ and $a^*_i$, wherein the transfer function $L_i(z)$ of the second-order FIR filter is $L_i(z)=(1-(a_i z^{-1})^M)\cdot(1-(a^*_i z^{-1})^M)$, wherein the transfer function $D_i(z)$ of the second-order IIR filter i is $D_i(z)=(1-a_i z^{-1})\cdot(1-a^*_i z^{-1})$, and wherein a and a* are complex parameters of the filter having an absolute value of 1, and defining stop and pole frequencies, and a* is a complex conjugate of parameter a.

17. A filter as claimed in claim 15, further comprising a first filter part having a transfer function of R(z) and a second filter part having a transfer function of $$\frac{L_1(z) \dots L_v(z)}{D_1(z) \dots D_p(z)},$$

the transfer function of the first filter part and the second filter part of the filter being $$H(z) = R(z)\frac{L_1(z) \dots L_p(z)}{D_1(z) \dots D_p(z)} \text{ or } H(z) = \frac{L_1(z) \dots L_p(z)}{D_1(z) \dots D_p(z)}R(z),$$

wherein the term $L_i(z)$ of the second-order FIR filter is $L_i(z)=(1-(a_i z^{-1})^M)\cdot(1-(a^*_i z^{-1})^M)$ and the term $D_i(z)$ of the second-order IIR filter is $D_i(z)=(1-a_i z^{-1})\cdot(1-a^*_i z^{-1})$, wherein p is a positive integer and $a_i$ is a complex parameter of the filter, the absolute value of which is 1 and which defines the stop and pole frequency, and a* is a complex conjugate of parameter a.

18. A filter as claimed in claim 15, wherein the transfer function of the filter comprises the term $G(z)=c(0)+ \dots +c(p)z^{-2pM}$ that is formed as a quotient $$G(z) = \frac{L_1(z) \dots L_v(z)}{D_1(z) \dots D_p(z)}$$

of products $L_1(z) \dots L_p(z)$ and $D_1(z) \dots D_p(z)$, and the filter is arranged to perform the filtering according to the term G(z) as FIR filtering, wherein the term $L_i(z)$ of FIR filtering corresponding to the second order is $L_i(z)=(1-(a_i z^{-1})^M)\cdot(1-(a^*_i z^{-1})^M)$ and the term $D_i(z)$ of IIR filtering corresponding to the second order is $D_i(z)=(1-a_i z^{-1})\cdot(1-a^*_i z^{-1})$, wherein p is a positive integer and $a_i$ is a complex parameter of the filter, the absolute value of which is 1 and which defines the stop and pole frequency, and a* is a complex conjugate of parameter a.

19. A filter as claimed in claim 18, wherein when one or more coefficients c(0) to c(p) are other than integers, at least one non-integer is rounded to an integer.

20. A filter as claimed in claim 15, wherein at least one second-order FIR filter term L(z), which is the pair of a second-order IIR filter D(z), is left out of the filter, whereby the term G(z) is $$G(z) = \frac{L_1(z) \dots L_v(z)}{D_1(z) \dots D_p(z)},$$

wherein v<p applies.

21. A filter as claimed in claim 13, wherein a transfer function of the at least one FIR filter comprises a term L(z) describing a second-order FIR filtering that is $L(z)=(1-(az^{-1})^M)\cdot(1-(a^*z^{-1})^M)$, wherein a and a* are complex parameters of the filter having an absolute value of 1 and defining stop frequencies, and a* is a complex conjugate of parameter a.

22. A filter as claimed in claim 21, wherein the real part of parameter a is $$1 - \frac{1}{2^T},$$

wherein T is a positive integer.

23. A filter as claimed in claim 13, wherein when the filter is a decimator, a portion of the filter is arranged to reset to zero the delay elements of each IIR filter when a decimated sample is taken, and said sampler is arranged to take a sample for decimation from an input signal of the delay elements of the IIR filter, wherein the decimated signal is used within the FIR filter.

24. A filter as claimed in claim 13, further comprising at least two comb filters which form a comb filter pair and which have a common parameter b affecting the filtering operation in such a manner that a transfer function of a first filter of the comb filter pair has a zero point of value b which is the stop frequency, and a transfer function of a second filter of the comb filter pair has a zero point value 1/b which is the stop frequency of the second comb filter, wherein b is real, positive and unequal to 1.

* * * * *